(12) United States Patent
Curtin et al.

(10) Patent No.: US 7,290,233 B2
(45) Date of Patent: Oct. 30, 2007

(54) METHOD FOR NETLIST PATH CHARACTERISTICS EXTRACTION

(75) Inventors: James J. Curtin, Fishkill, NY (US); Kevin M. McIlvain, Cold Spring, NY (US); Ray Raphy, Poughkeepsie, NY (US); Douglas S. Search, Red Hook, NY (US); Stephen Szulewski, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 295 days.

(21) Appl. No.: 11/129,786

(22) Filed: May 16, 2005

(65) Prior Publication Data

US 2006/0010411 A1   Jan. 12, 2006

Related U.S. Application Data

(63) Continuation-in-part of application No. 10/890,463, filed on Jul. 12, 2004, now Pat. No. 7,120,888.

(51) Int. Cl.
*G06F 17/50* (2006.01)

(52) U.S. Cl. ............................................. 716/6; 703/16
(58) Field of Classification Search .................. 716/6; 703/16
See application file for complete search history.

(56) References Cited

U.S. PATENT DOCUMENTS

| 5,218,551 A | * | 6/1993 | Agrawal et al. | ............... | 716/10 |
| 5,220,512 A | | 6/1993 | Watkins et al. | ............... | 716/11 |
| 5,365,463 A | * | 11/1994 | Donath et al. | ................ | 703/19 |
| 5,587,919 A | | 12/1996 | Cheng et al. | .................. | 716/2 |
| 5,636,372 A | * | 6/1997 | Hathaway et al. | .......... | 713/500 |

(Continued)

FOREIGN PATENT DOCUMENTS

JP   2000011680 A   1/2000

OTHER PUBLICATIONS

NN9601397, "Modelling Process Variation in System-Level Static Timing Analysis", IBM Technical Disclosure Bulletin, vol. 39, No. 1, Jan. 1996, pp. 397-402 (19 pages).*

(Continued)

*Primary Examiner*—Phallaka Kik
(74) *Attorney, Agent, or Firm*—Lynn L. Augspurger

(57) ABSTRACT

A circuit design method utilizes existing late mode worst case slack calculation functions inherent in timing path trace algorithms which only need to record the worst arrival and worst required arrival times at each netlist node as traced paths. Because of this, most individual path tracing is curtailed due to the likelihood that a more critical arrival or required arrival time has already been recorded at a given netlist node. Worst case slacks are then determined by subtracting the worst case arrival time from the worst case required arrival time. In this manner, worst case slack values are calculated for the entire netlist within a reasonable amount of time. The method uses these existing functions by querying the worst case slack at each netlist node under varied timing model scenarios. These varied timing model scenarios include altering the cell and net delays and arrival times in the model. Then, with the worst case slacks from the varied timing model scenarios in hand, the required priority factors, recoverability and path composition factors are computed by comparing the differences in the worst case slack at each netlist node.

13 Claims, 1 Drawing Sheet

U.S. PATENT DOCUMENTS

| | | | |
|---|---|---|---|
| 5,790,435 A | 8/1998 | Lewis et al. | 716/6 |
| 6,058,252 A * | 5/2000 | Noll et al. | 716/10 |
| 6,209,123 B1 | 3/2001 | Maziasz et al. | 716/14 |
| 6,430,731 B1 * | 8/2002 | Lee et al. | 716/6 |
| 6,470,482 B1 | 10/2002 | Rostoker et al. | 716/6 |
| 6,643,683 B1 | 11/2003 | Drumm et al. | 709/203 |
| 7,117,466 B2 | 10/2006 | Kalafala et al. | 716/6 |
| 7,142,991 B2 * | 11/2006 | Hathaway et al. | 702/57 |
| 7,206,958 B1 * | 4/2007 | Sutherland et al. | 713/500 |
| 2002/0013933 A1 | 1/2002 | Shiba | 716/4 |
| 2003/0192020 A1 * | 10/2003 | Collins | 716/6 |
| 2003/0229865 A1 | 12/2003 | Bakarian et al. | 716/4 |
| 2004/0088664 A1 * | 5/2004 | Srinivasan | 716/6 |
| 2004/0123259 A1 * | 6/2004 | You et al. | 716/6 |
| 2004/0153988 A1 | 8/2004 | Ito et al. | 716/11 |
| 2004/0205681 A1 | 10/2004 | Nozuyama | 716/4 |
| 2005/0066297 A1 * | 3/2005 | Kalafala et al. | 716/6 |
| 2005/0088887 A1 | 4/2005 | Wang | 365/201 |
| 2005/0262463 A1 | 11/2005 | Cohn et al. | 716/10 |
| 2006/0010411 A1 * | 1/2006 | Curtin et al. | 716/6 |
| 2006/0248486 A1 * | 11/2006 | Barnes | 716/6 |
| 2006/0259885 A1 | 11/2006 | Mortensen et al. | 716/7 |

OTHER PUBLICATIONS

NN950127, "Algorithm for Incremental Timing Analysis", IBM Technical Disclosure Bulletin, vol. 38, No. 1, Jan. 1995, pp. 27-34 (31 pages).*

NA9402189, "Process-Variation-Tolerant Zero Skew Clock Routing", IBM Technical Disclosure Bulletin, vol. 37, No. 2A, Feb. 1994, pp. 189-198 (15 pages).*

Ferrandi et al., "Symbolic Optimization of Interacting Controller Based on Redundancy Identification and Removal", IEEE Transactions on Computer-Aided Design of Integrated Circuits and Systems, vol. 19, No. 7, Jul. 2000, pp. 760-772.

* cited by examiner

METHOD FOR NETLIST PATH CHARACTERISTICS EXTRACTION

CROSS-REFERENCE TO RELATED APPLICATIONS

This application is a continuation in part of U.S. Ser. No. 10/890,463, now U.S. Pat. No. 7,120,888 filed Jul. 12, 2004, and entitled "Method, System and Storage Medium for Determining Circuit Placement" by James Curtin et al., and contains subject matter which is related to the subject matter of the following co-pending applications, each of which is assigned to the same assignee as this application, International Business Machines Corporation of Armonk, N.Y. Each of the below listed applications is hereby incorporated herein by reference in its entirety:

U.S. Ser. No. 11/129,784 filed May 16, 2005 concurrently herewith and entitled "Genie: a method for classification and graphical display of negative slack timing test failures"

U.S. Ser. No. 11/129,785 filed May 16, 2005 concurrently herewith and entitled "Negative Slack Recoverability Factor—A net weight to enhance timing closure behavior"

TRADEMARKS

IBM® is a registered trademark of International Business Machines Corporation, Armonk, N.Y., U.S.A. and other names used herein may be registered trademarks, trademarks or product names of International Business Machines Corporation or other companies. PISCES is a chip design computational tool used internally in IBM.

BACKGROUND OF THE INVENTION

1. Field of the Invention

This invention relates to integrated circuit design, and particularly to circuit placements on an integrated circuit chip.

2. Background

The motivation for the development of an improved method stemmed from the real life case of a particular netlist containing over 800,000 nets. Using the existing approach, a path extraction report request was initiated for 20,000 nets, a small fraction of the design. After 96 hours, the requested report generation was terminated because it had not successfully run to completion. The improved method, which is described in detail below, was then implemented and performed against the same netlist as before. Using the same computing power, the required path information for the entire netlist was extracted in under 20 minutes. As described in detail below, a total of 5 timing reports are required in order to fully compute the netlist path characteristics. They are independent reports that can be generated in parallel to further reduce run time when compared to serial execution.

As today's chip designs continue to grow in size and complexity, so too do the netlists that represent them. As a result, comprehensive extraction of path related information within these netlists can be extremely time consuming. A method is required to enable extraction of key path characteristics from netlists in order to drive chip design methodologies like PISCES which is described in U.S. Ser. No. 10/890,463, now U.S. Pat . No. 7,120,888 filed Jul. 12, 2004, and entitled "Method, System and Storage Medium for Determining Circuit Placement". It is to this need of PISCES that this application is directed.

The vast permutations required to collect such information makes extracting these path characteristics impractical when using traditional timing path trace algorithms. Depending on the topology of the combinational logic there could be a multitude of sub-paths between the launch and capture points. The number of sub-paths can grow exponentially in nature which makes extraction of the entire set of sub-paths time prohibitive. An improved method is required in order to be able to extract key path characteristics from the netlist in real time.

SUMMARY OF THE INVENTION

The shortcomings of the prior art are overcome and additional advantages are provided through the provision of a computer programmed chip design computation which utilizes the existing late mode worst case slack calculation functions inherent in timing path trace algorithms. These functions only need to record the worst arrival and worst required arrival times at each netlist node as paths are traced. Because of this, most individual path tracing is curtailed due to the likelihood that a more critical arrival or required arrival time has already been recorded at a given netlist node. Worst case slacks are then determined by subtracting the worst case arrival time from the worst case required arrival time. In this manner, worst case slack values are calculated for the entire netlist within a reasonable amount of time. The improved method makes use of these existing functions by querying the worst case slack at each netlist node under varied timing model scenarios. These varied timing model scenarios include altering the cell and net delays and arrival times in the model. With the worst case slacks from the varied timing model scenarios in hand, the required (PISCES methodology provided) priority factors, recoverability and path composition factors can then be computed by comparing the differences in the worst case slack at each netlist node.

Services for providing the computational processes and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Recoverability net weight generation in the PISCES tool methodology used at International Business Machines Corporation follows the steps described below.

By definition in the PISCES methodology, the recoverability net weight, REC_NW, is proportional to (non_optimizable_delay/total_path_block_delay) for each net in the worst case late mode path.

i.e. REC_NW=k (non_optimizable_delay/total_path_block_delay), where k is constant.

The non_optimizable_delay can be of two types. The delay due to any pre-characterized books such as SRAMs, RAs, I/Os, Cores etc. and/or the off chip delay added to a path by factors outside the chip. The total_path_block_delay is the sum of all individual block delays in a path.

Therefore, the generation of Recoverability net weight requires both the non_optimizable_delay and the total_path_block_delay for the worst case late mode path through each net. With the current methodology, the path delay information for any given path is obtained from the corresponding path-based end-point report. But as mentioned before in this document, generating a path-based report requires tracing each and every path that contains a non-optimizable timing element and can be an exponentially time consuming affair. In order to get around this problem, the capability of the timing tool to tag netlist nodes (nets/pins) with the slack of the worst case late mode path is utilized. The report generated using this approach will be referred to in this document as a "slack report". There are three slack report generations with different timing model scenarios involved in the Recoverability net weight calculation.

Figure 1:
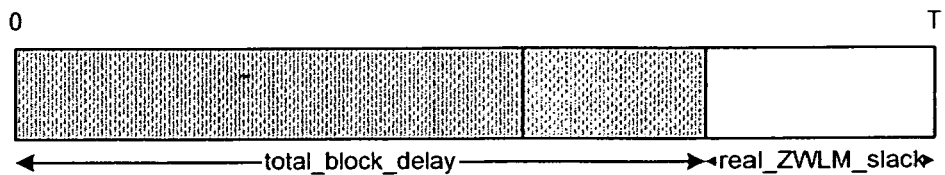
FIG. 1 illustrates a first slack report.

The first slack report is generated with a zero wire load model for the netlist. Zero Wire Load Model (ZWLM) is a timing model wherein all wire parasitics are removed from consideration in the timing model. The worst case ZWLM late mode slack (a.k.a. Placement Available Slack in PISCES, U.S. Ser. No. 10/890,463) associated with each net, and the corresponding clock phase are obtained using this run. Let us call this ZWLM slack as a variable real_ZWLM_slack. Refer to FIG. 1.

Figure 2:
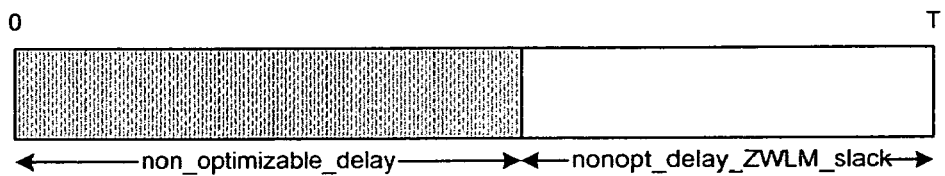
FIG. 2 illustrates a second slack report.

The second slack report is generated with the block delays for all the dust books, i.e. "dust delays", in the chip set to zero. A dust book can be defined as any book that is not identified as a non-optimizable book. So this zero dust delay slack report generates the worst case late mode slack value for each net for the same phase that generated zwlm_real_slack, with only the non-optimizable delays contributing to the total delay. Let us call this slack as a variable nonopt_delay_ZWLM_slack. Refer to FIG. 2.

Figure 3:
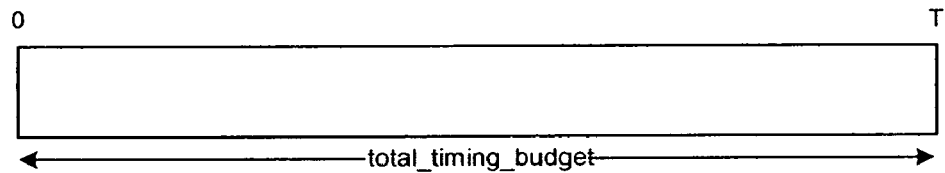
FIG. 3 illustrates a third slack report.

The third slack report is generated with "all" the delay values in the chip set to zero including the non-optimizable delays. As with the nonopt_delay_ZWLM_slack generation, this full zero delay slack is also generated for the same phase that generated the real_ZWLM_slack for each net. So this full zero delay slack value can be considered as the "total timing budget" for the worst case late mode path for each net. Let us call this variable total_timing_budget. Refer to FIG. 3.

The equation for the Recoverability net weight in PISCES is:

REC_NW=k (non_optimizable delay/total_block_delay)

So, once we have the above three slack values for all the nets, we can calculate the non optimizable delay using the total_timing_budget (See FIG. 3) as:

non_optimizable_delay=total_timing_budget−nonopt_delay ZWLM_slack and the total block delay as:

total_block_delay=total_timing_budget−real_ZWLM_slack

Therefore, we can represent the Recoverability net weight as:

REC_NW=k (total_timing_budget−nonopt_delay ZWLM_slack)/(total_timing budget−real_ZWLM_slack)

Path Composition net weight generation in the PISCES methodology can now be explained.

By definition in PISCES methodology, the Path Composition net weight, PC_NW, is proportional to the number of nets in the worst case late mode path for each net.

Therefore, the generation of Path Composition net weight requires the knowledge of the total number of nets in the worst case late mode path for each net. Again, the current method to get the number of nets in a path requires a path-based endpoint report. But it is impractical to generate a path-based report with the worst case paths for "all" the nets in the net list. Here also the capability of the timing tool to tag net list nodes with the worst case slack is utilized.

Figure 4:
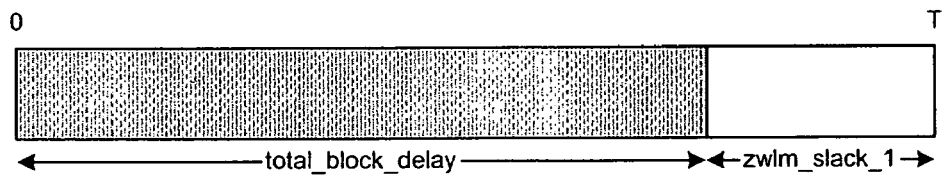
FIG. 4 illustrates a first ZWLM slack.

First, all the nets are tagged with a Zero Wire Load Model (ZWLM) slack and the corresponding phase for the worst path through the net. We call this slack value zwlm_slack_1. Refer to FIG. 4 for an illustration of a first ZWLM slack.

Figure 5:
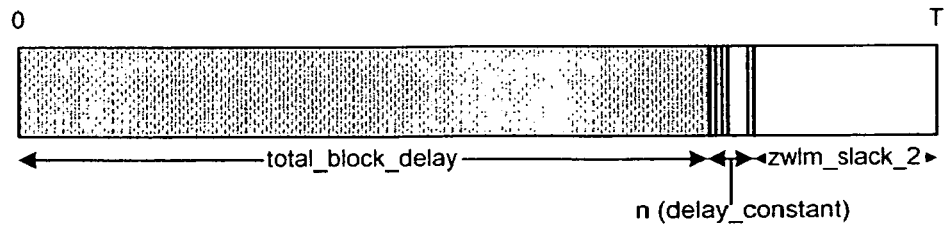
FIG. 5 illustrates a second ZWLM slack.

Then, a very small delay constant, called delay_constant, in the order of a few pico seconds, is added to each net and then recalculate the slack for the worst case path. Let us call this zwlm_slack_2. Refer to FIG. 5.

Then, the number of nets in the worst case timing path through any net can be calculated as:

number_of_nets_in_WC_path=(zwlm_slack_1−zwlm_slack_2)/delay_constant

The delay constant value must be chosen such that the addition of this value should not change the worst timing path through any net. Or at least the value has to be small enough so that the probability for this phenomenon is negligible. At the same time, the change in slack due to the addition of this delay value must be measurable by the timing tool. The capabilities of the present invention can be implemented in software, firmware, hardware or some combination thereof.

As one example, one or more aspects of the present invention can be included in media and use of the media as a service for manufacture of an article of manufacture (e.g., one or more computer chip products) having placement of calculated netlist positions with, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, can be provided tangibly embodying at least one program of instructions executable by the machine to perform the capabilities of the present invention.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for use in circuit design for a set of netlists, comprising the steps of:
    employing late mode worst case slack calculation functions inherent in timing path trace algorithms which record a worst case arrival and worst case required arrival times at each netlist node as traced paths, and
    determining worst case slacks by subtracting the worst case arrival time from the worst case required arrival time, and
    calculating worst case slack values for an entire set of netlist using said late mode worst case slack calculation functions by querying the worst case slack from varied timing model scenarios at each netlist node under varied timing model scenarios, and
    thereafter, with the worst case slacks in hand, computing required priority factors, recoverability and path composition factors for the netlists by comparing differences in the worst case slack at each node of said set of netlists.

2. The method according to claim 1 wherein in calculating late mode worst case calculation functions, individual path tracing is curtailed due to a likelihood that a more critical arrival or required arrival time has already been recorded at a given netlist node.

3. The method according to claim 1 wherein the varied timing model scenarios include altering cell and net delays and arrival times in the model.

4. The method according to claim 1, further including a step for calculating a nonoptimizable path delay for a worst case path of paths used, and for calculating a total path block delay using a total timing budget for the worst case path without regard to a number of clock cycles for the paths, and for calculating a number of nets in a worst case path.

5. A method for designing chips using a set of netlists and providing with computer tool computations for placement of said netlists, said method comprising the steps of:
    employing late mode worst case slack calculation functions inherent in timing path trace algorithms which record a worst case arrival and worst case required arrival times at each netlist node as traced paths, and
    determining worst case slacks by subtracting the worst case arrival time from the worst case required arrival time, and
    calculating worst case slack values an entire set of netlist using said late mode worst case slack calculation functions by querying the worst case slack from varied timing model scenarios at each netlist node under varied timing model scenarios, and
    thereafter, with the worst case slacks in hand, computing required priority factors, recoverability and path composition factors for the netlists by comparing differences in the worst case slack at each node of said set of netlists.

6. The method according to claim 5 wherein in calculating late mode worst case calculation functions, individual path tracing is curtailed due to a likelihood that a more critical arrival or required arrival time has already been recorded at a given netlist node.

7. The method according to claim 5 wherein the varied timing model scenarios include altering cell and net delays and arrival times in the model.

8. The method according to claim 5, further including a step for calculating a non-optimizable path delay for a worst case path of paths used, and for calculating a total path block delay using a total timing budget for the worst case path without regard to a number of clock cycles for the paths, and for calculating a number of nets in a worst case path.

9. Computer readable medium embedded thereon program code means for providing a method for designing chips using a set of netlists, said method comprising:
    providing with computer tool computations for placement of said netlists, including instructions for performing the steps of:
    employing late mode worst case slack calculation functions inherent in timing path trace algorithms which record a worst case arrival and worst case required arrival times at each netlist node as traced paths, and
    determining worst case slacks by subtracting the worst case arrival time from the worst case required arrival time, and
    calculating worst case slack values for an entire set of netlist using said late mode worst case slack calculation functions by querying the worst case slack from varied timing model scenarios at each netlist node under varied timing model scenarios, and
    thereafter, with the worst case slacks in hand, computing required priority factors, recoverability and path composition factors for the netlists by comparing differences in the worst case slack at each node of said set of netlists,
    and producing an article based on said computed factors.

10. The computer readable medium according to claim 9 wherein the varied timing model scenarios include altering cell and net delays and arrival times in the model.

11. The computer readable medium according to claim 9, wherein said article is an article of manufacture.

12. The computer readable medium according to claim 9, wherein said article produced is a part of a computer system.

13. The computer readable medium according to claim 9, said method further including steps for calculating a non-optimizable path delay for a worst case path of paths used, and for calculating a total path block delay using a total timing budget for the worst case path without regard to a number of clock cycles for the paths, and for calculating a number of nets in a worst case path.

* * * * *